United States Patent
Rettig et al.

(10) Patent No.: US 8,286,854 B2
(45) Date of Patent: Oct. 16, 2012

(54) MICROSYSTEM

(75) Inventors: Christian Rettig, Eningen U.A. (DE); Axel Franke, Ditzingen (DE); Ando Feyh, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 28 days.

(21) Appl. No.: 12/806,135

(22) Filed: Aug. 6, 2010

(65) Prior Publication Data

US 2011/0048132 A1 Mar. 3, 2011

(30) Foreign Application Priority Data

Sep. 3, 2009 (DE) .......................... 10 2009 029 180

(51) Int. Cl.
*B23K 20/00* (2006.01)

(52) U.S. Cl. ...................... 228/193; 438/106; 228/233.1
(58) Field of Classification Search .................. 228/193, 228/233.1; 438/106
See application file for complete search history.

(56) References Cited

U.S. PATENT DOCUMENTS

| | | | | |
|---|---|---|---|---|
| 6,644,536 | B2 * | 11/2003 | Ratificar et al. | 228/234.1 |
| 2002/0056742 | A1 * | 5/2002 | Rinne | 228/226 |
| 2010/0308455 | A1 * | 12/2010 | Kim et al. | 257/734 |

* cited by examiner

*Primary Examiner* — Nicholas D'Aniello
(74) *Attorney, Agent, or Firm* — Kenyon & Kenyon LLP

(57) ABSTRACT

A microsystem has a first cavity which is sealed off from the surroundings and a second cavity which is sealed off from the surroundings. The first cavity is bounded by a first bond joint and the second cavity is bounded by a second bond joint. Either the first bond joint or the second bond joint is a eutectic bond joint or a diffusion-soldered joint.

5 Claims, 2 Drawing Sheets

MICROSYSTEM

BACKGROUND OF THE INVENTION

1. Field of the Invention

The present invention relates to a microsystem, e.g., micromechanical sensor structure, and to a method for the production of such a microsystem.

2. Description of the Related Art

Micromechanical sensor structures are known from the related art. Micromechanical rotation rate sensors for determining rates of rotation about one or more axes are used, for example, in the automotive sector and in entertainment electronics for navigation, image stabilization and detection of movement. Such rotation rate sensors have a movable micromechanical element enclosed in a cavity. To obtain low damping and thus a high mechanical Q factor, the micromechanical element is typically enclosed at a very low gas pressure, for example at from 1 to 5 mbar. Micromechanical acceleration sensors serve to determine accelerations in one or more directions in space and are used, for example, for electronic stabilization programs, for airbag release and for attitude detection. Such acceleration sensors also have a movable micromechanical element enclosed in a cavity. To obtain a critical damping and thus a rapid settling of the movable element, the micromechanical element is typically enclosed in a cavity with a relatively high gas pressure, for example of around 800 mbar. It is also known for a plurality of rotation rate sensors and acceleration sensors to be combined in an inertial navigation system which makes it possible to track position and orientation by time integration of the individual signals.

The enclosure of the micromechanical elements in the cavities is done by wafer-level encapsulation, for example by seal glass bonding or eutectic bonding. In that procedure, the pressure used during bonding is enclosed in the interior of the cavity. If a plurality of chips is implemented on one chip, all of the encasing cavities have the same internal pressure. When seal glass bonding is employed, the bond pressure is increased in addition by solvent evaporation from the seal glass.

BRIEF SUMMARY OF THE INVENTION

An object of the present invention is to provide a microsystem having a first cavity and a second cavity which are sealed by different bond joints. It is a further object of the invention to provide a method for the production of such a microsystem.

A microsystem according to the present invention has a first cavity which is sealed off from the surroundings and a second cavity which is sealed off from the surroundings. The first cavity is bounded by a first bond joint and the second cavity is bounded by a second bond joint, wherein either the first bond joint or the second bond joint is a eutectic bond joint or a diffusion-soldered joint. Advantageously, different internal pressures may be obtained in the cavities of that microsystem. That allows different micromechanical sensors to be integrated on one chip. In that manner it is possible to obtain more highly integrated micromechanical sensor systems, which are cheaper and take up less space.

Preferably, in the first cavity there is a first pressure and in the second cavity there is a second pressure, wherein the first pressure and the second pressure are of different magnitudes. Advantageously, it is possible to arrange different sensors in the cavities, with the optimum internal pressure for operation of the respective sensor being provided for in each cavity.

In one embodiment, the first bond joint has aluminum and gold, and the second bond joint has aluminum and silicon. Advantageously, the first bond joint may then be closed by thermocompression bonding at a low temperature and the second bond joint may be closed by eutectic bonding at a higher temperature. In an alternative embodiment, the first bond joint has copper and the second bond joint has copper and tin. Those two bond joints also may advantageously be closed at differing temperatures and pressures.

Preferably, a first sensor structure is disposed in the first cavity and a second sensor structure is disposed in the second cavity. In that manner, it is advantageously possible to obtain highly integrated sensor components having a number of functions.

In a method according to the present invention for the production of a microsystem, a substrate and a capping wafer are joined to each other by bonding. In a first method step, the substrate and the capping wafer are joined to each other in a first region by a first bonding process at a first temperature and at a first ambient pressure, and in a further method step are joined to each other in a second region by a second bonding process at a second temperature and at a second ambient pressure, wherein either the first bonding process or the second bonding process is a eutectic bonding process or a diffusion-soldering process. That method advantageously allows the first ambient pressure and the second ambient pressure to be selected such that they differ.

In an example implementation of the method, method steps are additionally carried out beforehand to provide the substrate with a first surface, on which a first bonding frame and a second bonding frame are disposed, to provide the capping wafer with a second surface, on which a first further bonding frame and a second further bonding frame are disposed, wherein the second bonding frame and/or the second further bonding frame are/is interrupted by at least one opening, and for arranging the substrate and the capping wafer in such a manner that the first surface faces the second surface and the first bonding frame comes into contact with the first further bonding frame and the second bonding frame comes into contact with the second further bonding frame. The at least one opening in the second bonding frame or in the second further bonding frame advantageously allows the pressure in the second region to be adapted to the second ambient pressure before the capping wafer and the substrate are joined to each other in the second region by the eutectic bonding process or the diffusion-soldering process.

The second bonding frame and/or the second further bonding frame advantageously melt(s) briefly during the eutectic bonding or the diffusion-soldering, thereby closing the at least one opening in the second bonding frame and/or in the second further bonding frame. Advantageously, the second ambient pressure is then enclosed in the region that has been sealed off by the eutectic bonding process.

The first temperature is advantageously lower than the second temperature. That advantageously ensures that the bond joints may be produced one after the other.

Preferably, the first bonding frame has aluminum, the second bonding frame silicon, and the first and second further bonding frames have gold. In that case, the first temperature is above 300° C. and below 363° C. and the second temperature is 363° C. or above.

DETAILED DESCRIPTION OF THE INVENTION

Figure 1:
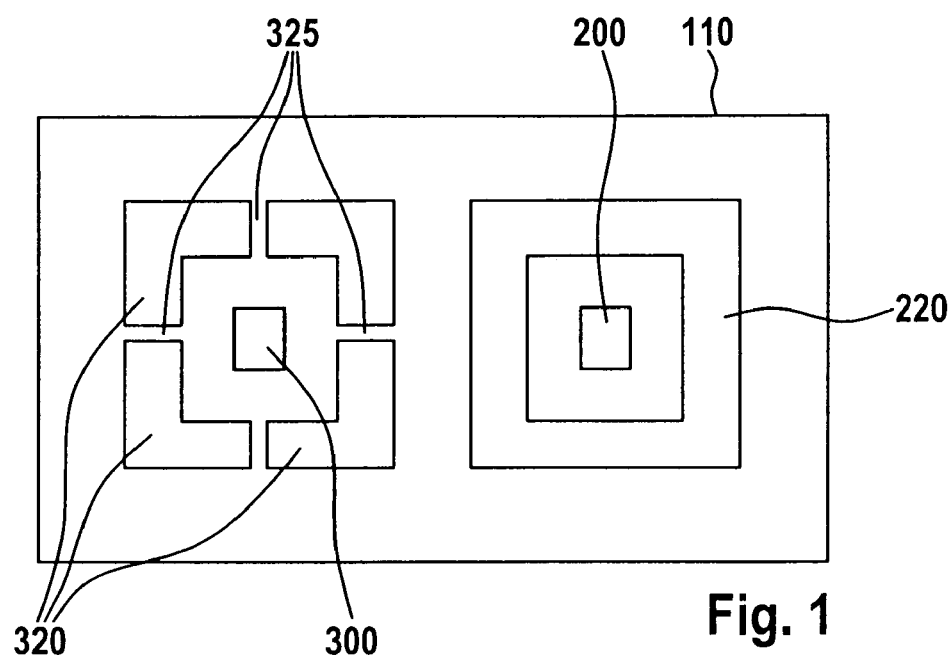
FIG. 1 is a plan view of a substrate.

FIG. 1 is a plan view of a substrate 110 shown schematically. Substrate 110 may, for example, be a silicon substrate. Substrate 110 may be a complete wafer or part of a wafer. Disposed on substrate 110 are a first sensor structure 200 and a second sensor, structure 300. Sensor structures 200, 300 may be micromechanical sensor structures, for example rotation rate sensors or acceleration sensors. For example, first sensor structure 200 may be a rotation rate sensor and second sensor structure 300 may be an acceleration sensor.

First sensor structure 200 is bounded by a first lower bonding frame 220 disposed on the surface of substrate 110. In the example of FIG. 1, first lower bonding frame 220 has the shape of an approximately square frame. First lower bonding frame 220 may, however, also have the shape of a circular ring or any other closed shape surrounding first sensor structure 200. First lower bonding frame 220 may, for example, consist of aluminum deposited on the surface of substrate 110. The height of first lower bonding frame 220 perpendicular to the surface of substrate 110 may in that case be, for example, from ½ µm to 10 µm. The width of first lower bonding frame 220 parallel to the surface of substrate 110 may, for example, be from 10 µm to 500 µm, preferably 100 µm in size.

Second sensor structure 300 is bounded all round by a second lower bonding frame 320. Second lower bonding frame 320 has four openings 325 at which second lower bonding frame 320 is interrupted. It is also possible for fewer or more than four openings 325 to be provided, but at least one opening 325 is provided. In the example illustrated, second lower bonding frame 320 also has the shape of an approximately square frame. As with the shape of first lower bonding frame 220, however, a different shape may be selected for second lower bonding frame 320. The dimensions of second lower bonding frame 320 approximately correspond to those of first lower bonding frame 220. Second lower bonding frame 320 may, for example, consist of silicon.

Figure 2:
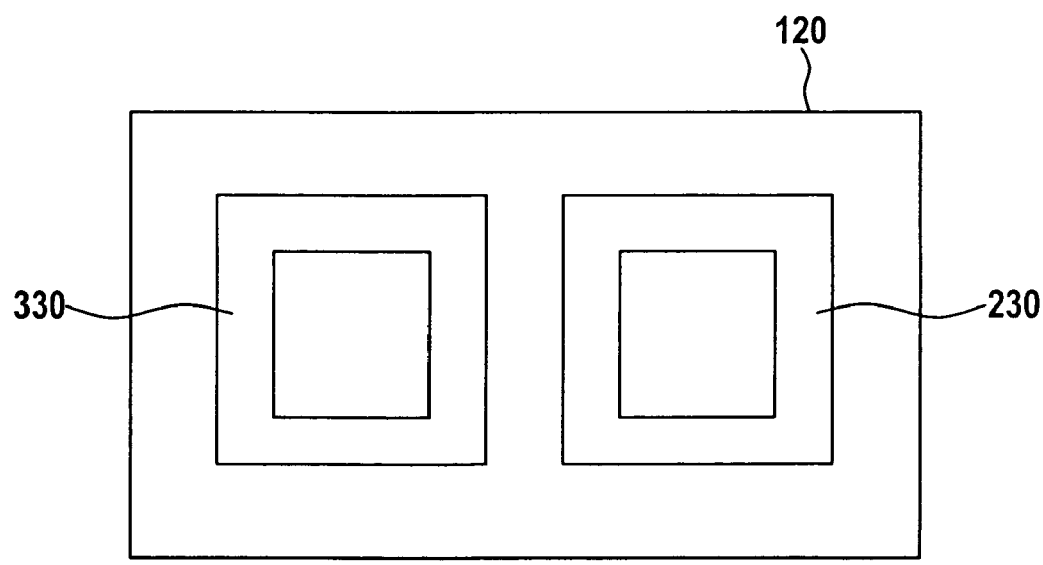
FIG. 2 is a plan view of a capping wafer.

FIG. 2 is a plan view of a capping wafer 120 shown schematically. Capping wafer 120 serves to encapsulate sensor structures 200, 300 disposed on substrate 110. Capping wafer 120 may consist, for example, of silicon or glass. Capping wafer 120 may be a complete wafer or part of a wafer. Disposed on the surface of capping wafer 120 are a first upper bonding frame 230 and a second upper bonding frame 330. The position and size of first upper bonding frame 230 and second upper bonding frame 330 are so selected that first upper bonding frame 230 may be brought into registration with first lower bonding frame 220 on substrate 110 and second upper bonding frame 330 may be brought into registration with second lower bonding frame 320 on substrate 110. First upper bonding frame 230 and second upper bonding frame 330 may, for example, consist of gold deposited on capping wafer 120. Like second lower bonding frame 320, second upper bonding frame 330 may have openings at which second upper bonding frame 330 is interrupted. If second upper bonding frame 330 has such openings, openings 325 in second lower bonding frame 320 may optionally be omitted.

Figure 3:
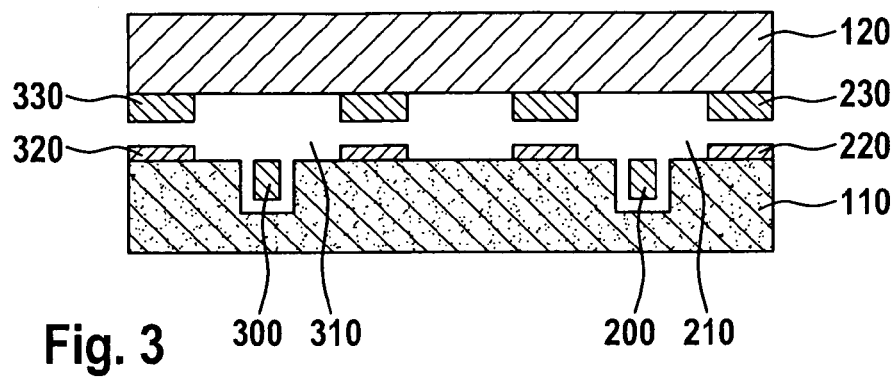
FIG. 3 shows a section through a microsystem at a first processing stage.
Figure 4:
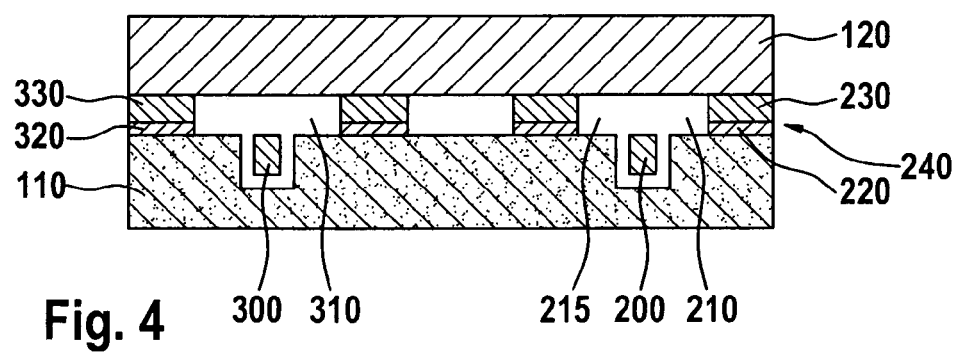
FIG. 4 shows a section through the microsystem at a second processing stage.
Figure 5:
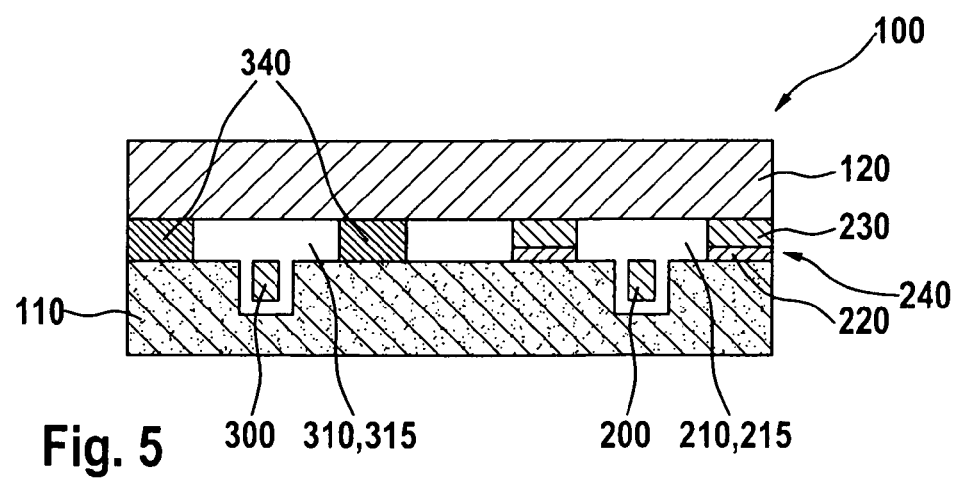
FIG. 5 shows a section through the microsystem at a third processing stage.

Substrate 110 and capping wafer 120 may be joined to each other to enclose or encapsulate first sensor structure 200 and second sensor structure 300. For this, first lower bonding frame 220 has to be joined to first upper bonding frame 230 and second lower bonding frame 320 has to be joined to second upper bonding frame 330. In so doing, first sensor structure 200 is enclosed in a first cavity 210 and second sensor structure 300 is enclosed in a second cavity 310. If first sensor structure 200 and second sensor structure 300 make different demands on the ambient pressure, different internal pressures have to be enclosed in first cavity 210 and in second cavity 310. FIGS. 3 to 5 show different processing steps for the production of such a joint between substrate 110 and capping wafer 120.

FIG. 3 shows in a sectional view that the surface of substrate 110 exhibiting lower bonding frames 220, 320 and the surface of capping wafer 120 exhibiting upper bonding frames 230, 330 are first arranged facing each other in such a manner that first lower bonding frame 220 is opposite first upper bonding frame 230 and second lower bonding frame 320 is opposite second upper bonding frame 330. Substrate 110 and capping wafer 120 are then brought into contact with each other at a first pressure in a bonding system. Depending on the pressure obtainable in the bonding system, first pressure 215 may, for example, be from $10^{-3}$ mbar to over 1000 mbar.

There then follows a first phase of the bonding process, which is illustrated schematically in FIG. 4. The ambient temperature in the bonding system is increased to a first temperature, at which first lower bonding frame 220 and first upper bonding frame 230 are joined to each other by thermocompression bonding. The first temperature is typically above 300° C. and less than 363° C. Preferably, the first temperature is approximately 350° C. While first lower bonding frame 220 and first upper bonding frame 230 are being joined to each other by thermocompression bonding, a first bond joint 240 is produced which encloses a first cavity 210 surrounding first sensor structure 200. In that operation, first pressure 215 is enclosed in first cavity 210. First cavity 210 is enclosed, therefore, by substrate 110, capping wafer 120 and first bond joint 240 and is so leak-tight that first pressure 215 in first cavity 210 is maintained.

Second lower bonding frame 320 and second upper bonding frame 330 are also in contact with each other, but have not yet been joined to each other. By virtue of openings 325 in second lower bonding frame 320 and/or in second upper bonding frame 330, it is possible for pressure equalization to take place between the region surrounding second sensor structure 300 and the ambient environment of substrate 110 and capping wafer 120. Thereafter, the ambient pressure in the bonding system is changed to a second pressure 315. Second pressure 315 may be higher or lower than first pressure 215 and similarly, depending on the capabilities of the bonding system, may be from $10^{-3}$ mbar to over 1000 mbar. Via openings 325, second pressure 315 is also established in the ambient environment of second sensor structure 300. The temperature in the bonding system is then increased to a second temperature, which is preferably equal to or greater than 363° C. First bond joint 240 is not adversely affected by the increase in temperature to produce second bond joint 340. At a temperature of 363° C., a eutectic bonding process occurs between second lower bonding frame 320 and second upper bonding frame 330. In that process, the silicon of second lower bonding frame 320 and the gold of second upper bonding frame 330 are joined to each other and briefly melt, thereby producing second bond joint 340. During the melting process, openings 325 in second lower bonding frame 320 and/or in second upper bonding frame 330 are closed. That produces in the area surrounding second sensor structure 300 a second cavity 310 which is bounded by substrate 110, capping wafer 120 and second bond joint 340 and in which second pressure 315 is enclosed. Second cavity 310 also is so leak-tight that second pressure 315 is retained. FIG. 5 shows the completed microsystem 100 in schematic section.

Instead of using the above-mentioned material systems for lower bonding frames 220, 320 and upper bonding frames 230, 330, other bonding materials may also be used. It is important merely that first bond joint 240 is produced at a lower temperature than second bond joint 340 and that second bond joint 340 is a eutectic bond or another bond during the production of which a brief liquefaction of the bonding materials occurs which results in openings 325 being fused closed. As an alternative material system, first lower bonding frame 220 and first upper bonding frame 230 may, for example, both have copper, and second lower bonding frame 320 and second upper bonding frame 330 may have copper and tin. In that case, the second bond joint is formed from tin and copper by what is called a solid-liquid interdiffusion (SLID) bonding process. That process is also referred to as diffusion soldering. In that case also, a brief liquefaction of the bonding materials occurs.

What is claimed is:

1. A method for producing a microsystem, comprising:
in one method step, at a first temperature and at a first ambient pressure, a substrate and a capping wafer are joined to each other in a first region by a first bonding process such that the first region encloses a first cavity at the first ambient pressure; and
in a further method step, at a second temperature and at a second ambient pressure, the substrate and the capping wafer are joined to each other in a second region by a second bonding process such that the second region encloses a second cavity at the second ambient pressure;
wherein one of the first bonding process or the second bonding process is one of a eutectic bonding process or a diffusion-soldering process and wherein the first ambient pressure is different than the second ambient pressure.

2. The method as recited in claim 1, further comprising the following additional steps performed before the bonding in the first region by the first bonding process:
providing the substrate with a first surface having a first bonding frame and a second bonding frame disposed;
providing the capping wafer with a second surface having a first further bonding frame and a second further bonding frame; and
arranging the substrate and the capping wafer in such a manner that the first surface faces the second surface, the first bonding frame comes into contact with the first further bonding frame, and the second bonding frame comes into contact with the second further bonding frame;
wherein at least one of the second bonding frame and the second further bonding frame is interrupted by at least one opening.

3. A method for producing a microsystem, comprising:
in one method step, at a first temperature and at a first ambient pressure, a substrate and a capping wafer are joined to each other in a first region by a first bonding process such that the first region encloses a first cavity at the first ambient pressure; and
in a further method step, at a second temperature and at a second ambient pressure, the substrate and the capping wafer are joined to each other in a second region by a second bonding process such that the second region encloses a second cavity at the second ambient pressure;
before the bonding in the first region by the first bonding process:
providing the substrate with a first surface having a first bonding frame and a second bonding frame disposed;
providing the capping wafer with a second surface having a first further bonding frame and a second further bonding frame; and
arranging the substrate and the capping wafer in such a manner that the first surface faces the second surface, the first bonding frame comes into contact with the first further bonding frame, and the second bonding frame comes into contact with the second further bonding frame;
wherein at least one of the second bonding frame and the second further bonding frame is interrupted by at least one opening;
wherein one of the first bonding process or the second bonding process is one of a eutectic bonding process or a diffusion-soldering process;
wherein at least one of the second bonding frame and the second further bonding frame melts briefly during the one of the eutectic bonding or the diffusion-soldering to cause the at least one opening in the at least one of the second bonding frame and the second further bonding frame to be closed.

4. The method as recited in claim 3, wherein the first temperature is lower than the second temperature.

5. The method as recited in claim 4, wherein:
the first bonding frame includes aluminum and the second bonding frame includes silicon;
the first further bonding frame and the second further bonding frame include gold;
the first temperature is above 300° C. and below 363° C.; and
the second temperature is equal to or greater than 363° C.

* * * * *